United States Patent [19]

Plants et al.

[11] Patent Number: 5,625,301

[45] Date of Patent: Apr. 29, 1997

[54] FLEXIBLE FPGA INPUT/OUTPUT ARCHITECTURE

[75] Inventors: William C. Plants, Santa Clara; Sinan Kaptanoglu, San Carlos; Jung-Cheun Lien, San Jose; King W. Chan, Los Altos; Khaled A. El-Ayat, Cupertino, all of Calif.

[73] Assignee: Actel Corporation, Sunnyvale, Calif.

[21] Appl. No.: 444,243

[22] Filed: May 18, 1995

[51] Int. Cl.$^6$ .................................................. H03K 19/177
[52] U.S. Cl. .................................................. 326/41; 326/39
[58] Field of Search .................................. 326/38, 39, 41

[56] References Cited

U.S. PATENT DOCUMENTS

| | | | |
|---|---|---|---|
| 4,684,830 | 8/1987 | Tsui et al. | 307/465 |
| 4,706,216 | 11/1987 | Carter | 365/94 |
| 4,713,557 | 12/1987 | Carter | 307/242 |
| 4,717,912 | 1/1988 | Harvey et al. | 340/825.83 |
| 4,721,868 | 1/1988 | Cornell et al. | 307/465 |
| 4,742,252 | 5/1988 | Agrawal | 307/465 |
| 4,745,305 | 5/1988 | Crafts | 307/475 |
| 4,758,746 | 7/1988 | Birkner et al. | 307/465 |
| 4,783,606 | 11/1988 | Goetting | 307/465 |
| 4,857,774 | 8/1989 | El-Ayat et al. | 307/465 |
| 4,870,300 | 9/1989 | Nakaya et al. | 307/303 |
| 4,870,302 | 9/1989 | Freeman | 307/465 |
| 4,873,459 | 10/1989 | El Gamal et al. | 307/465 |
| 4,912,709 | 3/1990 | Teske et al. | 371/22.1 |
| 4,933,577 | 6/1990 | Wong et al. | 307/465 |
| 4,937,471 | 6/1990 | Park et al. | 307/296.5 |
| 4,983,959 | 1/1991 | Breuninger | 340/825.83 |
| 5,012,185 | 4/1991 | Ohfuji | 324/158 |
| 5,027,011 | 6/1991 | Steele | 307/465 |
| 5,046,035 | 9/1991 | Jigour et al. | 364/716 |
| 5,073,729 | 12/1991 | Greene | 326/41 |
| 5,083,083 | 1/1992 | El Ayat et al. | 324/158 |
| 5,121,394 | 6/1992 | Russell | 371/22.1 |
| 5,122,685 | 6/1992 | Chan et al. | 307/465 |
| 5,132,571 | 7/1992 | McCollum et al. | 307/465.1 |
| 5,144,166 | 9/1992 | Camarota et al. | 307/465.1 |
| 5,151,623 | 9/1992 | Agrawal | 307/465 |
| 5,157,282 | 10/1992 | Ong et al. | 307/443 |
| 5,208,491 | 5/1993 | Ebeling et al. | 307/465 |
| 5,220,213 | 6/1993 | Chan et al. | 307/465 |
| 5,220,215 | 6/1993 | Douglas et al. | 307/465 |
| 5,221,865 | 6/1993 | Philips et al. | 307/465 |

(List continued on next page.)

FOREIGN PATENT DOCUMENTS

WO92/08286  5/1992  WIPO .................... H03K 19/177

*Primary Examiner*—Edward P. Westin
*Assistant Examiner*—Benjamin D. Driscoll
*Attorney, Agent, or Firm*—D'Alessandro & Ritchie

[57] ABSTRACT

An input/output architecture for a field-programmable gate array integrated circuit including a plurality of logic function modules in an array of rows and columns, each of the modules having at least one input conductor and at least one output conductor; a plurality of interconnect conductors, comprising a plurality of input/output pads; a plurality of input/output kernels, each input/output kernel comprising an input buffer having a data input connected to one of the I/O pads and a data output connected to an input buffer data conductor, an output buffer having a data input connected to an output buffer data conductor, a data output connected to the I/O pad, and an enable input connected to an output buffer enable conductor; the input buffer data conductors extending in either the row or the column direction, different ones of the input buffer data conductors extending different numbers of rows or columns, the input buffer data conductors forming first intersections with inputs of the modules; the output buffer data conductors and output buffer enable conductors extending in either the row or the column direction, different ones of the output buffer data conductors and output buffer enable conductors extending different numbers of rows or columns, the input buffer data conductors forming second intersections with outputs of the modules; and user-programmable interconnect elements connected across selected ones of the first and second intersections.

35 Claims, 8 Drawing Sheets

U.S. PATENT DOCUMENTS

| | | | |
|---|---|---|---|
| 5,231,588 | 7/1993 | Agrawal et al. | 364/489 |
| 5,296,759 | 3/1994 | Sutherland | 326/47 |
| 5,317,210 | 5/1994 | Patel | 307/465 |
| 5,317,698 | 5/1994 | Chan | 395/325 |
| 5,319,252 | 6/1994 | Pierce et al. | 307/263 |
| 5,400,262 | 3/1995 | Mohsen et al. | 364/489 |
| 5,412,261 | 5/1995 | Whitten | 326/39 |
| 5,424,589 | 6/1995 | Dobbelaere | 326/41 |
| 5,896,296 | 1/1990 | Turner et al. | 365/189.08 |

FLEXIBLE FPGA INPUT/OUTPUT ARCHITECTURE

BACKGROUND OF THE INVENTION

1. Field of the Invention

The present invention relates to field programmable gate array (FPGA) architectures. More particularly, the present invention relates to FPGA architectures with flexible input/output capabilities.

2. The Prior Art

In recent years, field-programmable gate array integrated circuits have established themselves as staples in the electronics industry. Integrated circuit architectures for such products typically comprise an array of logic function modules which may be user configured to implement a large variety of logic functions. A programmable interconnect architecture, comprising a plurality of initially uncommitted interconnect conductors is superimposed over the array of logic function modules to enable custom connections to be made among the inputs and outputs of individual ones of logic function modules. A plurality of input/output (I/O) modules are disposed on the integrated circuit, usually around the periphery of the array, and are used to transfer logic signals to and from the array to off-chip circuit nodes. The I/O modules are connectable to the inputs and the outputs of the logic function modules via the programmable interconnect architecture.

The aforementioned elements of a typical FPGA array may be selectively connected to one another by the use of user-programmable interconnect elements. User-programmable interconnect elements may take several forms such as one-time-programmable antifuse elements, transistors, RAM cells, etc. These forms of user-programmable interconnect elements are known to those of ordinary skill in the art.

An example of a transistor-interconnect-element based FPGA architecture is disclosed in U.S. Pat. No. 4,870,302 to Freeman. Products embodying this type of architecture are marketed by Xilinx, Inc. of San Jose, Calif. In this architecture, transistors controlled by RAM cells are selectively turned on to make interconnections between logic function modules. Another such example is found in U.S. Pat. No. 5,187,393 to El Gamal et al., which uses EPROM or EEPROM transistors. The flexibility of such an architecture due to its reprogrammability is, however, offset to some extent by the relatively high on resistance of the transistors used to implement the interconnections.

Examples of several aspects of antifuse-based FPGA architectures are disclosed in U.S. Pat. No. 4,758,745 to El Gamal et al., U.S. Pat. No. 4,873,459 to El Gamal et al., U.S. Pat. No. 5,073,729 to Greene et al., U.S. Pat. No. 5,083,083 to El Ayat et al., and U.S. Pat. No. 5,132,571 to McCollum et al.

The I/O architectures of prior art FPGA devices usually takes one of two forms. In a first form, exemplified by U.S. Pat. No. 4,758,745, a plurality of I/O modules are disposed on the integrated circuit, preferably located near the periphery of the integrated circuit. Each of the I/O modules may be configured by an end user to be either an input module or an output module by appropriate programming. Examples of typical I/O modules are found in U.S. Pat. No. 5,017,813 to Galbraith et al., and U.S. Pat. No. 5,083,083 to El Ayat et al. (See FIG. 6).

The I/O module is typically directly coupled to an I/O pad and contains both input and output buffers, as well as control circuitry for determining whether the module will function as an input module or an output module. An input node, an output node, and at least one control node of the I/O module are connected to individual conductors in the general interconnect architecture of the integrated circuit whereby the I/O module may be connected to inputs and outputs of logic function modules disposed on the integrated circuit. In such prior-art architectures embodied in FPGA products designed by Actel Corporation, assignee of the present invention, the interconnect conductors associated with the input node, an output node, and at least one control node of the I/O module typically run the length of two to four rows in the array.

The second form of prior-art FPGA I/O architecture simply employs an output conductor and a buffered input conductor connected to an I/O pad on the integrated circuit. The output conductor and the input conductor are extended into the array of logic function modules for a fixed distance, usually enough to provide interconnection to a single logic function module located near the periphery of the integrated circuit. An example of such an architecture is illustrated at page 212 of the QuickLogic 1994 Databook from QuickLogic of Santa Clara, Calif.

While the prior art has been able to provide an arrangement by which inputs may be provided to, and outputs may be obtained from logic function modules in an integrated circuit, there is room for improvement of I/O architectures used in FPGA and other devices.

It is an object of the present invention to provide an I/O architecture for FPGA and other user-programmable integrated circuit devices which is more flexible than the prior-art architectures.

It is an object of the present invention to provide an I/O architecture for FPGA and other user-programmable integrated circuit devices which avoids having to provide fixed location I/O modules.

It is yet another object of the present invention to provide an I/O architecture for FPGA and other user-programmable integrated circuit devices which provides dedicated horizontal and vertical routing conductors for input, output and control signals with numerous segmentation and interconnect element options and variations.

Another object of the present invention is to provide an I/O architecture for FPGA and other user-programmable integrated circuit devices with depopulation of programmable interconnect elements to reduce capacitance and increase speed.

Yet another object of the present invention is to provide an I/O architecture for FPGA and other user-programmable integrated circuit devices with long dedicated horizontal and vertical routing conductors for input and output signals, but with short routing conductors for control signals.

It is a further object of the present invention to provide an I/O architecture for FPGA and other user-programmable integrated circuit devices including series user-programmable interconnect elements on selected routing conductors to allow unused routing conductors to be used for general interconnect.

A further object of the present invention is to provide an I/O architecture for FPGA and other user-programmable integrated circuit devices which allows ganging more than one output buffer to provide increased output drive.

BRIEF DESCRIPTION OF THE INVENTION

According to the present invention, a flexible I/O architecture is provided for use in FPGA and other user-programmable integrated circuit devices.

In a first embodiment of the present invention, an input/output architecture is provided for a field-programmable gate array integrated circuit. Such an FPGA device includes a plurality of logic function modules in an array of rows and columns. Each of the modules has at least one input conductor and at least one output conductor. More typically, however, each module will have a plurality of inputs and may have several outputs. An interconnect architecture is superimposed on the array of logic function modules and comprises a plurality of interconnect conductors which may be used to connect together the inputs and outputs of the logic function modules by programming user-programmable interconnect elements.

The I/O architecture of the present invention employs a plurality of input/output kernels. Each input/output kernel is associated with an I/O pad on the integrated circuit and includes an input buffer having a data input connected to one of the I/O pads and a data output connected to an input buffer data conductor, an output buffer having a data input connected to an output buffer data conductor, a data output connected to the I/O pad, and an enable input connected to an output buffer enable conductor. The input buffer data conductors and output buffer data conductors extend in either the row or the column direction.

According to the present invention, different ones of the input buffer data conductors and output buffer data conductors extend different numbers of rows or columns. User-programmable interconnect elements may be used to make connections between the inputs and outputs of the logic function modules and the input buffer data conductors and output buffer data conductors.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons. Such skilled persons will also recognize that the disclosure is made herein referring to orientations defined in terms of rows and columns of logic function modules but that such terms are interchangeable merely by rotating the frame of reference 90° in either direction.

Figure 1:
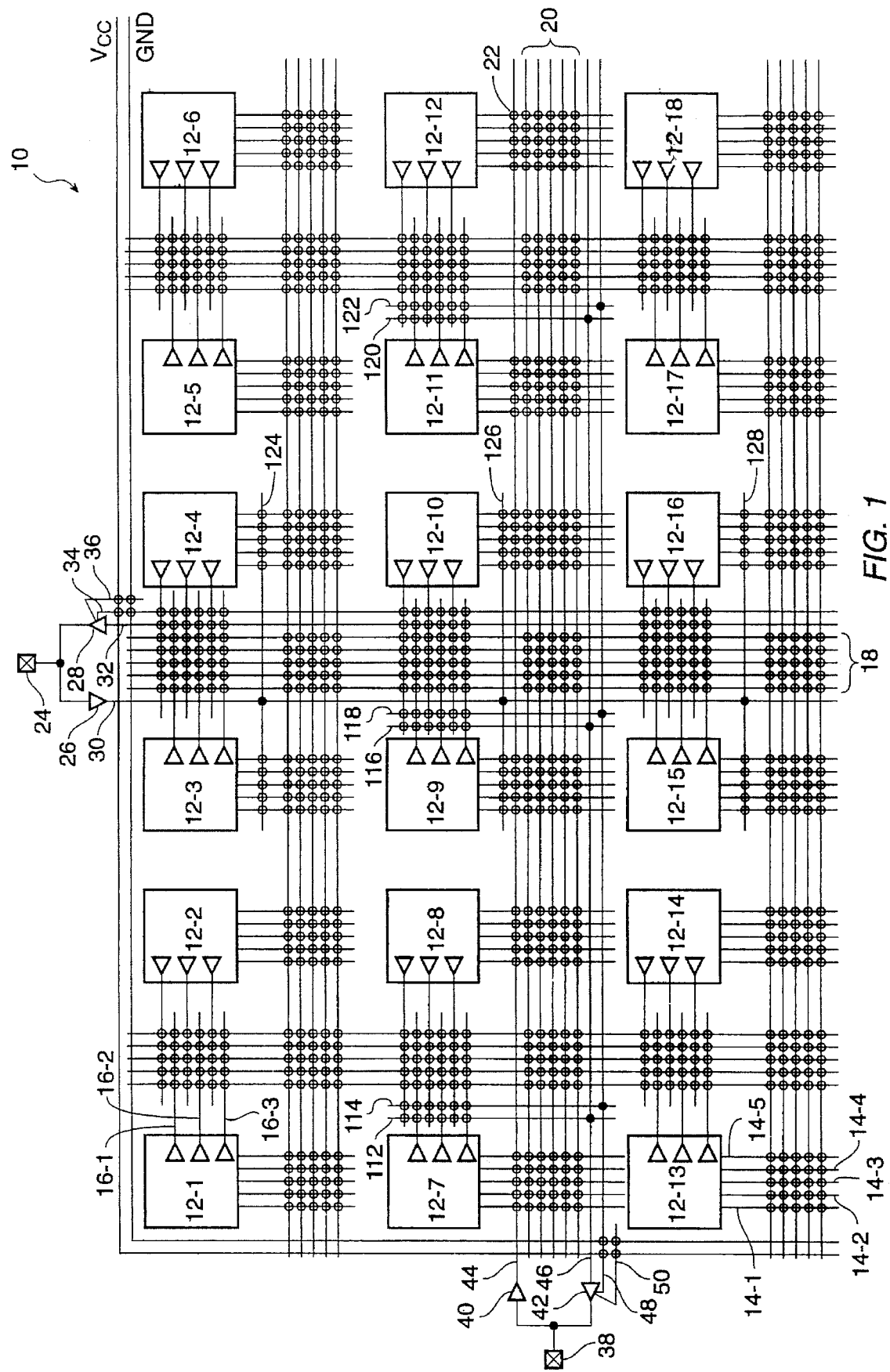
FIG. 1 is a block diagram of a typical FPGA array further including one aspect of the I/O architecture of the present invention according to which dedicated I/O conductors extend different distances into an array of logic function modules and are connectable to inputs and outputs of different numbers of logic function modules in either the row or column direction.
Figure 2:
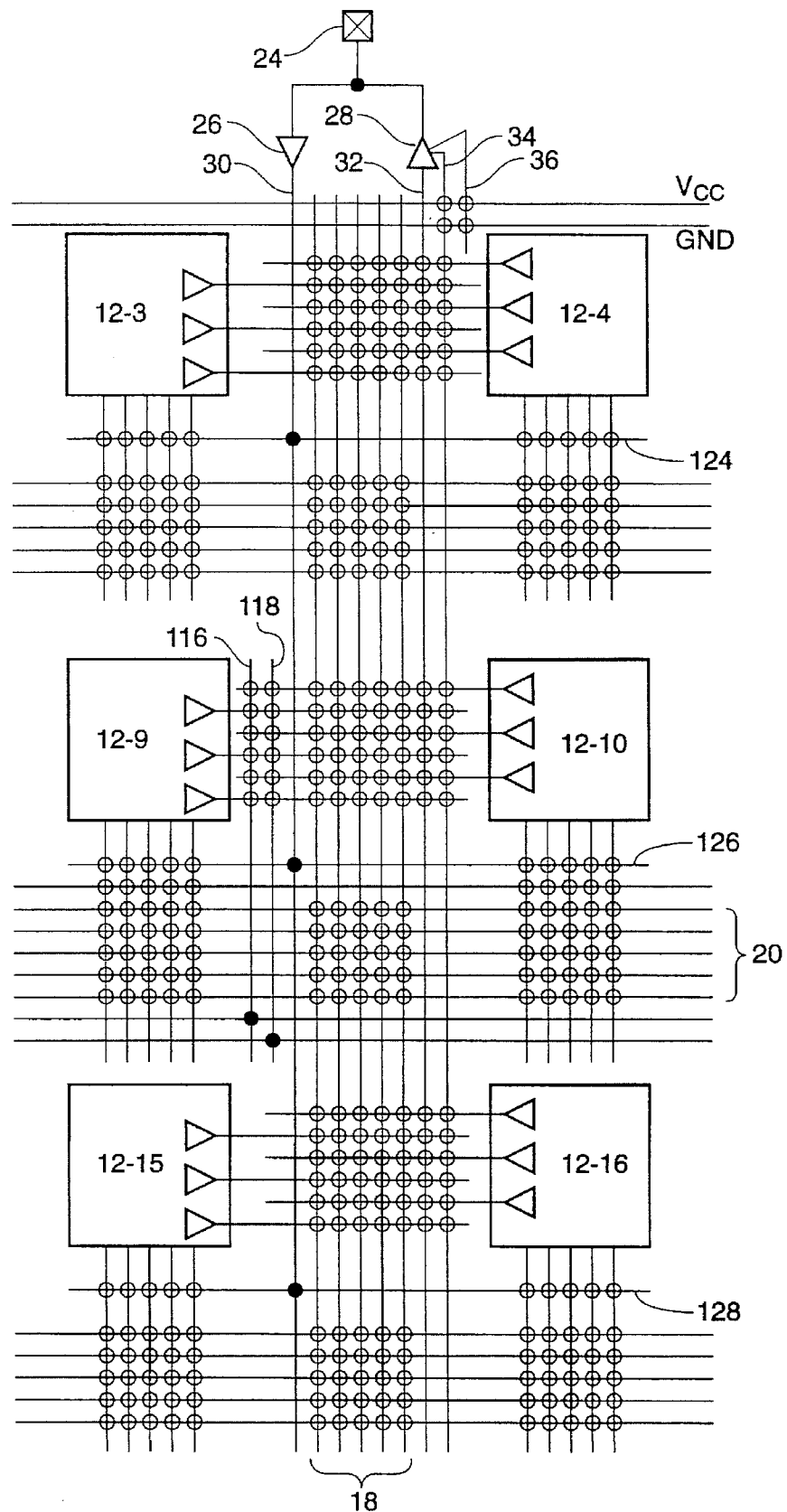
FIG. 2 is a more detailed block diagram of the architecture of FIG. 1, showing the portion comprising a pair of columns of the array and a single vertically oriented I/O kernel.
Figure 3:
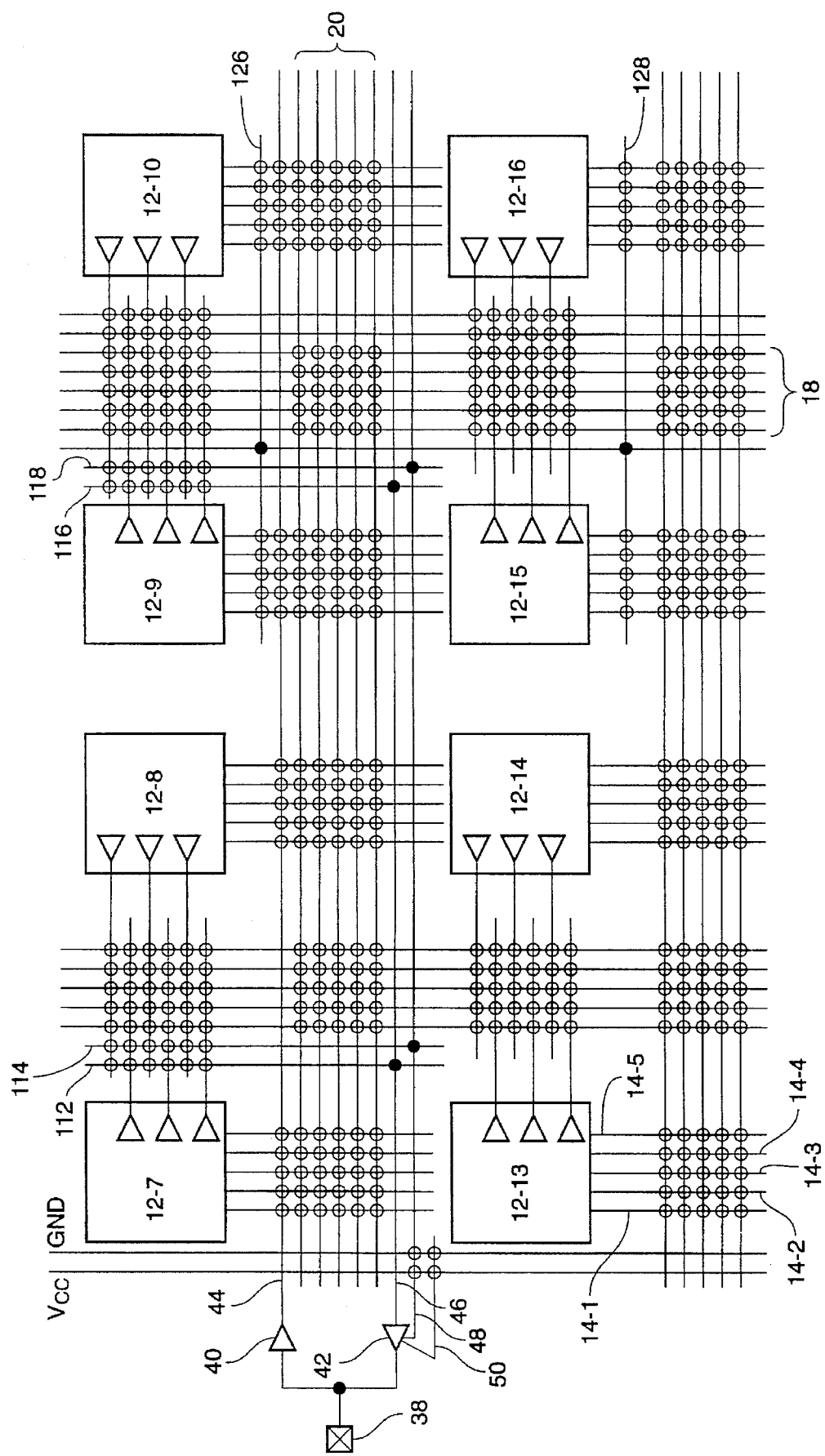
FIG. 3 is a more detailed block diagram of the architecture of FIG. 1, showing the portion comprising a pair of rows of the array and a single horizontally oriented I/O kernel.

Referring first to FIGS. 1 through 3, a block diagram is presented of a typical FPGA array further including one aspect of the I/O architecture of the present invention. According to this aspect of the invention, dedicated I/O conductors extend different distances into an array of logic function modules and are connectable to inputs and outputs of different numbers of logic function modules in either the row or column direction.

The present invention functions in a user-programmable integrated circuit environment, typically an FPGA environment. An array 10 of logic function modules 12-1 through 12-18 is disposed on the integrated circuit. Those of ordinary skill in the art will recognize that the embodiment shown in FIG. 1 is merely illustrative and that any number of logic function modules 12 may be disposed on a single integrated circuit die. In actual integrated circuits fabricated according to the teachings of the present invention, hundreds or thousands of such logic function modules 12 may be present in the array 10.

There are numerous known logic function module 12 designs which are available to be employed in the present invention. A non-exhaustive exemplary list of examples includes those disclosed and claimed in U.S. Pat. Nos. 4,758,745, 4,910,917, 5,055,718, and in co-pending application Ser. No. 08/332,550, filed Oct. 28, 1994. Those of ordinary skill in the art will appreciate that the particular logic function module 12 selected for an actual realization of the present invention in silicon will be largely a matter of design choice.

Those of ordinary skill in the art will understand that the function performed by any one of the logic function modules 12-1 through 12-18 is usually programmable, rather than being predefined by the manufacturing process. Schemes and circuits for programming the functions of the logic function modules 12-1 through 12-18 are known in the art and are beyond the scope of this disclosure.

Each of logic function modules 12-1 through 12-18 is shown having a number of inputs. For purposes of illustration, each of logic function modules 12-1 through 12-18 is shown including five inputs 14-1 through 14-5 (labelled in module 12-13), which extend downward from the block representing the logic function module. In actual integrated circuits, the number of inputs 14 for each logic function module 12-1 through 12-18 will be determined by the type of module employed, and the inputs may extend in other directions or indeed may extend in more than one direction to facilitate interconnection.

Each of logic function modules 12-1 through 12-18 is also shown having a number of outputs. For purposes of illustration, each of logic function modules 12-1 through 12-18 is shown including three outputs 16-1 through 16-3 (labelled in module 12-1), which extend either to the right or left of the block representing the logic function module 12-1 through 12-18. In actual integrated circuits, the outputs 16-1 through 16-3 may also extend in other directions or indeed may extend in more than one direction to facilitate interconnection.

An interconnect architecture is superimposed on the array of logic function modules 12-1 through 12-18. The interconnect architecture comprises a plurality of horizontal and vertical interconnect conductors. For clarity and ease of understanding the figure, the horizontal and vertical interconnect conductors are shown running between the logic function modules 12-1 through 12-18, but those of ordinary skill in the art will understand that actual layouts of integrated circuits according to the present invention may employ a "sea of modules" architecture like that disclosed and claimed in U.S. Pat. No. 5,132,571 to McCollum et al. wherein the interconnect conductors may be disposed directly over the logic function modules 12-1 through 12-18 in one or more metal interconnect layers.

As will be appreciated by those of ordinary skill in the art, the individual interconnect conductors in the interconnect architecture may run the entire length or width of the array; some may be segmented into various lengths as is known in the prior art. One of the various forms of user-programmable interconnect elements may be used to connect the segments of the interconnect conductors to one another, and to the inputs 14-1 through 14-5 and outputs 16-1 through 16-3 of the logic function modules 12-1 through 12-18. Examples of such known elements include antifuses, transistors, RAM cells, non-volatile memory cells, etc. The operation and programming of such elements, including circuitry for accomplishing the programming and for defining the particular connections to be made is known in the art and is not repeated herein in order to avoid obfuscating the disclosure.

In the illustrative embodiment of FIG. 1, the horizontal and vertical interconnect conductors are shown grouped into channels which are depicted as multiple conductor lines running between the logic function modules 12-1 through 12-18 in both the horizontal and vertical directions. For example, a group of five vertical interconnect conductors collectively identified by the reference numeral 18 is shown running down the array between logic function module pairs 12-3 and 12-4, 12-9 and 12-10, and 12-15 and 12-16. Likewise, a group of five horizontal interconnect conductors collectively identified by the reference numeral 20 is shown running across the array between logic function module pairs 12-7 and 12-13, 12-8 and 12-14, 12-9 and 12-15, 12-10 and 12-16, 12-11 and 12-17, and 12-12 and 12-18. The number of interconnect conductors used in an actual embodiment of the invention will be a matter of design choice.

As may be seen from an examination of FIG. 1, numerous user-programmable interconnect elements (shown as small circles, an illustrative one labelled with reference numeral 22) are disposed at the intersections between the horizontal and vertical interconnect conductors, at intersections between the horizontal interconnect conductors and the inputs of the logic function modules, and at intersections between the vertical interconnect conductors and the outputs of the logic function modules. Thus, the twenty-five intersections formed by the meeting of the five vertical interconnect conductors 18 and the five horizontal interconnect conductors 20 are all populated by antifuses, as are other intersecting interconnect conductors. Those of ordinary skill in the art will recognize that the degree to which the intersections are populated by antifuses is a matter of design choice and in many cases 100% population is not desired.

In addition, the five vertical interconnect conductors 18 are shown intersecting outputs 16-1 through 16-3 from logic function modules 12-3 and 12-4, 12-9 and 12-10, and 12-15 and 12-16, the outputs 16-1 through 16-3 from logic function modules 12-3, 12-9, and 12-15 approaching the five vertical interconnect conductors 18 from the left and the outputs 16-1 through 16-3 from logic function modules 12-4, 12-10, and 12-16 approaching the five vertical interconnect conductors 18 from the right. Each of these intersections is also populated with a user-programmable interconnect element.

The five horizontal interconnect conductors 20 are shown intersecting inputs 14-1 through 14-5 of logic function modules 12-7 through 12-12, the inputs 14-1 through 14-5 to logic function modules 12-7 through 12-12 approaching the five horizontal interconnect conductors 20 from above. Each of these intersections is also populated with a user-programmable interconnect element.

Throughout this disclosure, the term "I/O kernels" will be employed. As used herein, "I/O kernel" refers to an I/O unit associated with a single I/O pad on the integrated circuit. There are two such I/O kernels shown on FIG. 1. The first may be seen most clearly with reference to FIG. 2 and includes I/O pad 24, input buffer 26, and output buffer 28. The data input of input buffer 26 is connected to I/O pad 24 and the data output of output buffer 28 is also connected to I/O pad 24. The output of input buffer 26 is connected to a data output conductor 30. The input of the output buffer 28 is connected to a data input conductor 32. Finally, as shown in FIG. 1, output buffer 28 is equipped with enable input conductor 34 and slew control input conductor 36. Enable input conductor 34 is used to place the output of output buffer 28 into a high impedance state to disable it as is known in the art, for example, when the I/O kernel is used as an input to the integrated circuit. Slew control input conductor 36 is used to control the slew rate of output buffer 28 in a manner known in the art. Various ways of implementing the functions of enable input 34 and slew control input 36 are known in the art and will not be discussed further herein.

The second I/O kernel may be seen most clearly with reference to FIG. 3 and includes I/O pad 38, input buffer 40, and output buffer 42. The data input of input buffer 40 is connected to I/O pad 38 and the data output of output buffer 42 is also connected to I/O pad 38. As with the first I/O kernel, the output of input buffer 40 is connected to a data output conductor 44 of the I/O kernel. The input of the output buffer 42 is connected to a data input conductor 46 of the I/O kernel. Finally, output buffer 42 is also equipped with enable input conductor 48 and slew control input conductor 50. Those of ordinary skill in the art will recognize that the two I/O kernels shown in the figures are only illustrative and that the number of such I/O kernels actually employed in an actual integrated circuit fabricated according to the teachings of the present invention will be a matter of design choice. Such skilled persons will note that this arrangement is more flexible than the prior-art arrangement using dedicated I/O modules, which are usually assigned to a limited amount of area around the periphery of the integrated circuit die.

An important aspect of the present invention concerns the nature and routing of the data output conductors 30 and 44 of input buffers 26 and 40, respectively, the data input conductors 32 and 46 of output buffers 28 and 42, respectively, and the one or more enable and slew control input conductor 34 and 36 and 48 and 50 of the output buffers 28 and 42 of each I/O kernel in the architecture of the present invention. The nature and routing of these lines creates a powerful and flexible I/O structure and will be disclosed herein in detail.

The interface between the interconnect conductors, the inputs 14-1 through 14-5 and outputs 16-1 through 16-3 of the logic function modules 12-1 through 12-18 and the I/O kernels according to this aspect of the present invention is shown most clearly in FIG. 2, the detail in the vertical direction in the array showing the first I/O kernel, and FIG. 3, the detail in the horizontal direction in the array showing the second I/O kernel.

According to a presently-preferred embodiment of the invention, the data input and output conductors 32 and 30, and 46 and 44 are lightly populated with user programmable elements. Full population clearly provides the greatest connectivity but also adds capacitive loading. Partial population of these conductors is desirable to achieve the circuit performance required. As may be seen from an examination of FIG. 1, enable and slew control input conductors 34 and 36 and 48 and 50 of the output buffers 28 and 42 of each I/O kernel in the architecture of the present invention are connectable to either Vcc or ground through user-programmable interconnect elements. Whereas the enable input conductors 34 and 48 of output buffers 28 and 42, respectively, are connectable to logic function modules 12-1 through 12-18 in the array 10, the slew rate control inputs 36 and 50 of output buffers 28 and 42, respectively, are connectable only to the Vcc or ground tracks.

Figure 4:
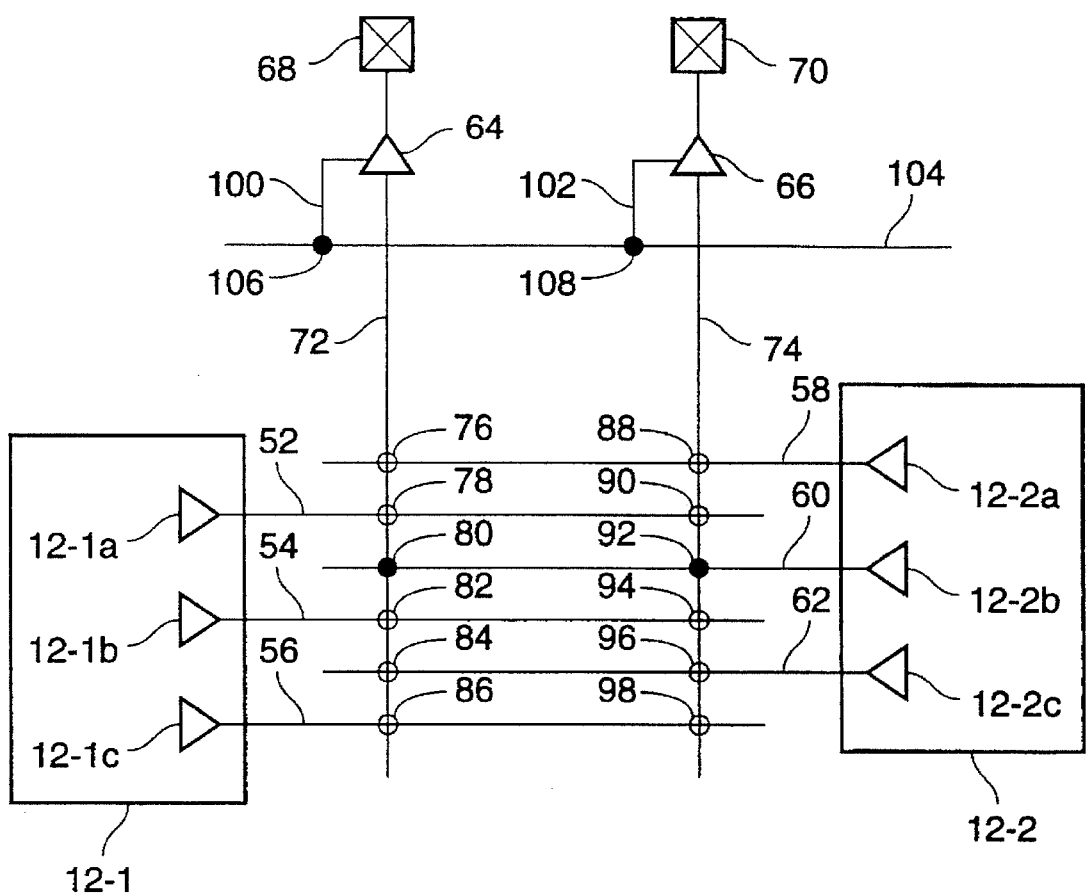
FIG. 4 is a more detailed block diagram of a portion of an FPGA array such as that depicted in FIG. 1, and shows the ability to gang-connect output buffers for increased drive according to the present invention.

Referring now to FIG. 4, another aspect of the present invention is illustrated. This aspect of the present invention permits gang-connecting of output buffers for increased drive according to the present invention.

In FIG. 4, two representative logic function modules 12-1 and 12-2 are shown. Unnecessary details of the architecture has been omitted to facilitate an understanding of this aspect of the invention. Logic function modules 12-1 and 12-2 are shown each having three output buffers, 12-1a, 12-1b, and 12-1c, and 12-2a, 12-2b, and 12-2c, respectively. These output buffers drive logic function module output lines 52, 54, 56, 58, 60, and 62, respectively. Portions of two output kernels are shown including output buffers 64 and 66 driving I/O pads 68 and 70, respectively. The input conductors 72 and 74 to output buffers 64 and 66 cross logic function module output lines 52, 54, 56, 58, 60, and 62. The intersections are fully populated by user-programmable interconnect elements 76, 78, 80, 82, 84, 86, 88, 90, 92, 94, 96, and 98, shown as circles.

There is a particular advantage to providing the output buffer input conductors 72 and 74 of two output buffers in the same region of the integrated circuit where they can be programmably connected to the same output node of one of the logic function modules 12-1 and 12-2. By connecting the inputs of two output buffers to the same drive signal, an output having a high drive capability may be configured.

As shown in FIG. 4, user-programmable interconnect elements 80 and 92 have been programmed (indicated by the solid circles). Thus the output buffer 12-2b of logic function module 12-2 drives the input of both output buffers 64 and 66. The user will tie I/O pads 68 and 70 together, resulting in a high-drive-capability output node. For example, where each output buffer 64 and 66 can drive 12 mA, ganging them together provides an output drive of 24 mA.

Also shown in FIG. 4, the enable input lines 100 and 102 of output buffers 64 and 66 are shown intersecting line 104. User-programmable interconnect elements 106 and 108 (shown as solid circles) have been programmed to allow control of output buffers 64 and 66 from the single line 104. Those of ordinary skill in the art will recognize that the enable signal on line 104 may come from a variety of sources. Line 104 may be a general interconnect line, a special enable line as will be disclosed further herein, the output of one of the input buffers in an I/O kernel, a fixed voltage such as ground or Vcc, etc. The source of such a signal is not part of the present invention but is rather a part of any circuit design which could be imposed on the integrated circuit architecture of which the present invention is a part.

Figure 5:
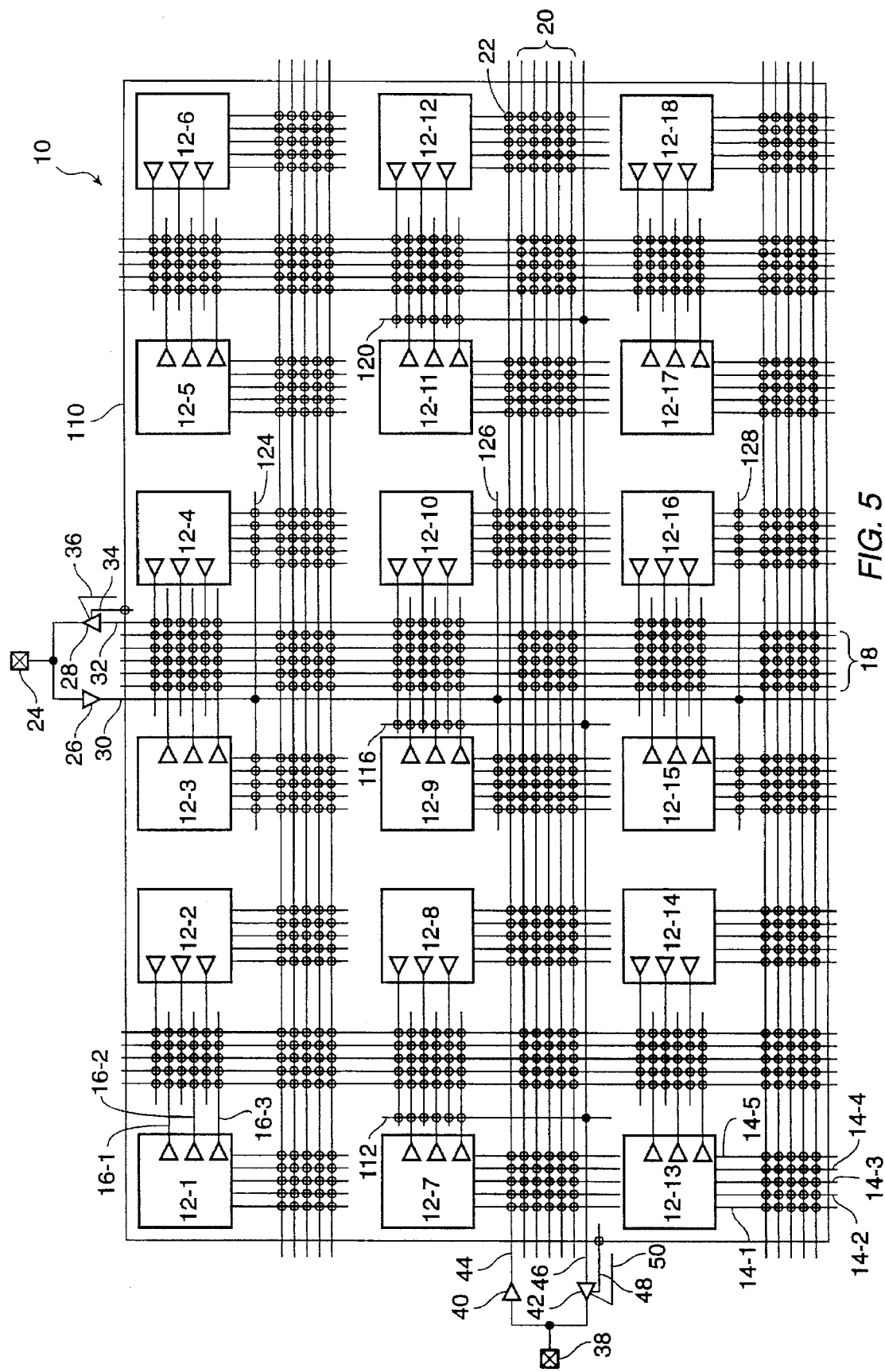
FIG. 5 is a more detailed block diagram of a portion of an FPGA array such as that depicted in FIG. 1, and illustrates an aspect of the present invention by which global enable signals may be routed in both the horizontal and vertical directions along both rows and columns of the array.

FIG. 5 is a more detailed block diagram of a portion of an array 10 such as that depicted in FIG. 1, and illustrates an aspect of the present invention by which global enable signals may be routed in both the horizontal and vertical directions along both rows and columns of the array. FIG. 5 looks much the same as FIG. 1 with the addition of a "bent" global enable line 110 which may be used to enable the output buffers of any number of I/O kernels by programming the user-programmable interconnect elements which are disposed at the intersections of the global enable line 110 and the enable inputs of any of the output buffers for which global enable is desired.

Global enable line 110 is shown traversing the periphery of the array 10 in both the row and column directions. Global enable line 110 is shown traversing both the top and bottom of the array 10 in the row direction and both the left and right sides of the array in the column direction. Those skilled in the art will recognize that global enable line 110 need not occupy all four sides of the array 10, and that it could occupy two or three of the sides and remain within the scope of the present invention. Such skilled persons will also recognize that global enable line 110 need not be located at the periphery of the array 10 so long as the enable inputs of the buffers are connectable to it. Such a global enable line 110 may also be used for other functions in the array 10, such as clock signal routing.

Referring again to FIG. 1, another aspect of the present invention permits connections to be made from an output of a logic function module to the input conductor of an output buffer using a single user-programmable interconnect element even if the input conductor of the output buffer runs in the same direction as the output conductors of the logic function module.

Data input conductor 46 of output buffer 42 runs in the row direction of the array, but so do the output conductors of the logic function modules 12-1 through 12-18. From an examination of FIG. 1, it may be seen that spur 112 of data input conductor 46 and spur 114 of enable input conductor 48 extend in the column direction in between logic function modules 12-7 and 12-8, forming intersections with their output conductors. These intersections are populated with user-programmable interconnect elements. Likewise, spur 116 of data input conductor 46 and spur 118 of enable input conductor 48 extend in the column direction in between logic function modules 12-9 and 12-10, forming intersections with their output conductors, and spur 120 of data input conductor 46 and spur 122 of enable input conductor 48 extend in the column direction in between logic function modules 12-11 and 12-12, forming intersections with their output conductors. These intersections are also populated with user-programmable interconnect elements. Because conductors 112, 116, and 120, are hardwired to data input conductor 46 of output buffer 42 and conductors 114, 118, and 122 are hardwired to enable input conductor 48 of output buffer 42, only a single user-programmable element at the intersection of the output of the logic function module and the one of spurs 112, 114, 116, 118, 120, and 122 is required to connect the data input and enable input conductors of the output buffers to the driving signals from the logic function modules.

This same aspect of the present invention permits connections to be made from an output of an input buffer to the input conductor of a logic function module using a single user-programmable interconnect element even if the output conductor of the input buffer runs in the same direction as the input conductors of the logic function module. Data output conductor 30 of input buffer 26 runs vertically down the array between the column containing logic function modules 12-3, 12-9, and 12-15 and the column containing logic function modules 12-4, 12-10, and 12-16. However, the inputs 14-1 through 14-5 of logic function modules 12-3, 12-4, 12-9, 12-10, 12-15, and 12-16 also run in the vertical direction.

According to the present invention, spur 124 runs off in both the left and right directions from data output conductor 30 of input buffer 26 and intersects the five inputs 14-1 through 14-5 of both logic function modules 12-3 and 12-4. Spur 126 runs off in both the left and right directions from data output conductor 30 of input buffer 26 and intersects the five inputs 14-1 through 14-5 of both logic function modules 12-9 and 12-10. Spur 128 runs off in both the left and right directions from data output conductor 30 of input buffer 26 and intersects the five inputs 14-1 through 14-5 of both logic function modules 12-15 and 12-16. All of these intersections may be populated with user-programmable interconnect elements, thus allowing connection to the inputs of any of these logic function modules by programming a single user programmable interconnect element.

As will be appreciated by persons of ordinary skill in the art, the prior-art alternative to this aspect of the present invention is to employ a portion of the general interconnect architecture to make connections such as these. This alternative requires the signals to pass through the on-resistance of at least two user-programmable interconnect elements, thus degrading the performance of the net created by the interconnections.

Figure 6A:
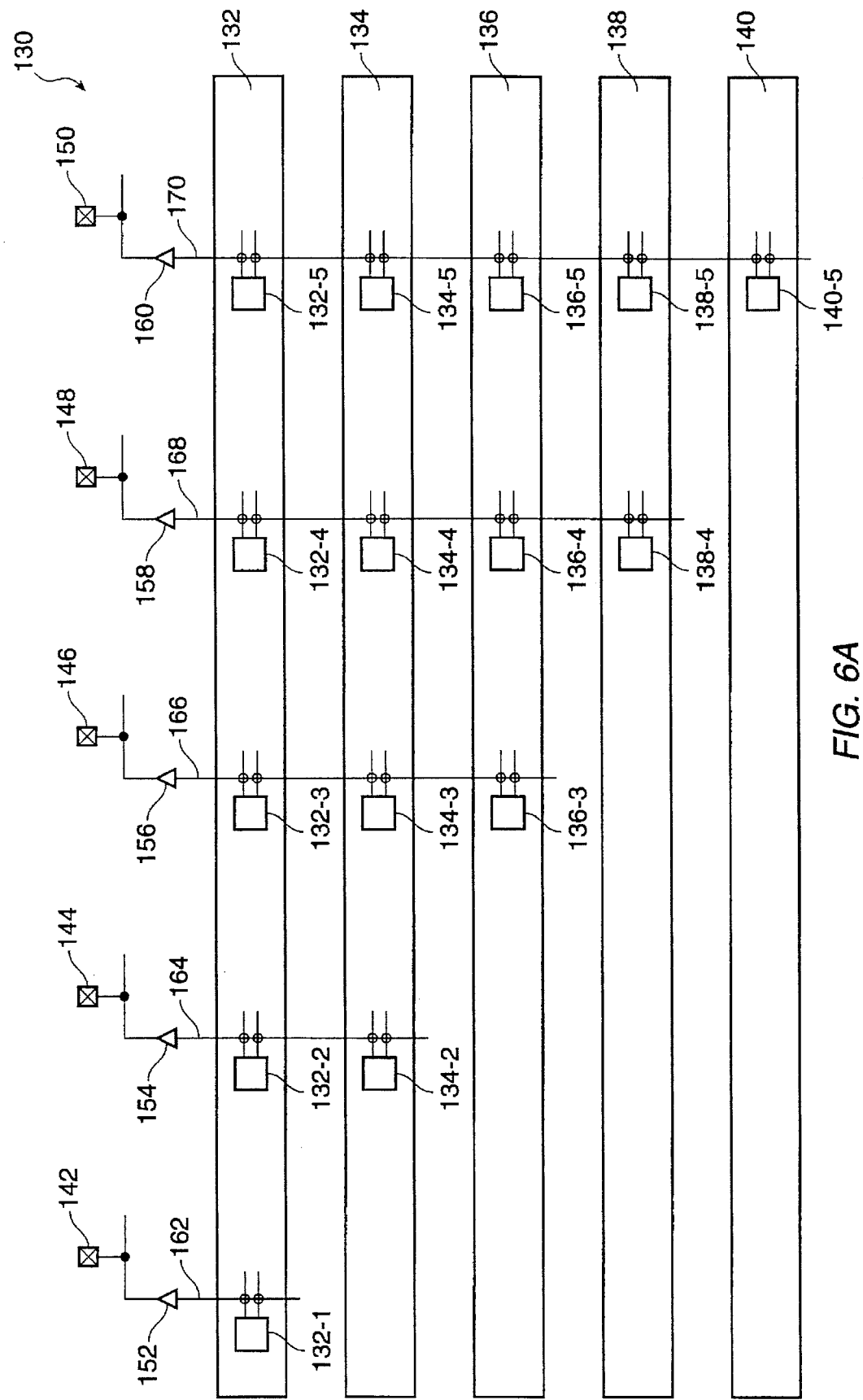
FIG. 6a is a block diagram of an FPGA array illustrating a feature of the invention according to which input conductors to different output buffers extend different distances into the array.
Figure 6B:
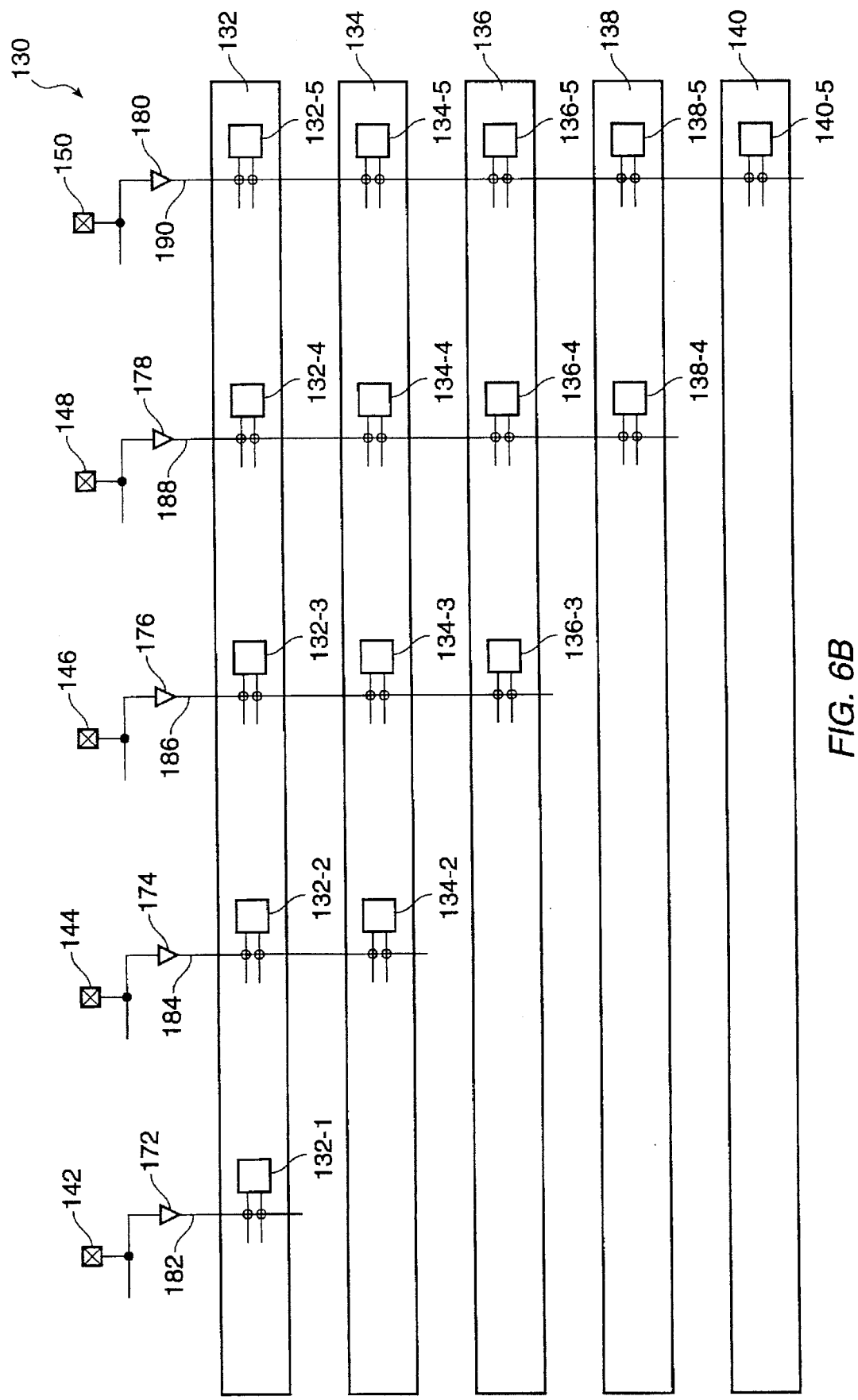
FIG. 6b is a block diagram of an FPGA array illustrating a feature of the invention according to which output conductors of different input buffers extend different distances into the array.

According to another aspect of the present invention illustrated in FIGS. 6a and 6b, the data output conductors and data input conductors associated with the I/O kernels of the architecture of the present invention have varying lengths. For example, any of these conductors may run the entire length of a row or column of the array, or may be smaller, for example, they may run some fraction of the length of a row or column of the array, e.g., one-quarter, one-third, one-half, etc. or a fixed number of modules (an integer from one to n where n is the number of modules in a row or column of the array. Alternately, the length of any individual one of the input, output, control, or enable conductors may be measured in terms of the number of logic function modules in a row or column to which they may be connected by user-programmable elements. This versatility is unknown in the prior art, which either teaches use of dedicated I/O modules located on the periphery of the integrated circuit die, or teaches that I/O related conductors penetrate a fixed distance into the area of the array.

This aspect of the present invention attempts to maximize the advantages of use of long and short lengths of data input and output connector lengths. Longer conductor lengths provide greater connectivity by penetrating deeper into the logic array and are able to reach more logic function modules. However, long conductor lengths are more expensive than short conductors since they occupy more silicon area. Further, longer lengths carry more capacitance and may slow down circuit performance. Careful choice of lengths is therefore desired as a matter of design choice.

FIG. 6a is a block diagram of an array illustrating the feature of the invention according to which input conductors to different output buffers extend different distances into the array. In the illustrative array 130 depicted in FIG. 6a, five rows (or columns) of the array 130 are shown as rectangles 132, 134, 136, 138, and 140. While persons of ordinary skill in the art will recognize that the array 130 is similar to the array 10 depicted in FIG. 1, unnecessary detail has been omitted in order to avoid overcomplicating the figure and thus obscuring the feature of the invention which FIG. 6a is intended to show.

I/O pads 142, 144, 146, 148, and 150 are shown connected to the outputs of output buffers 152, 154, 156, 158, and 160, respectively. Input conductors 162, 164, 166, 168, and 170 provide input data to output buffers 152, 154, 156, 158, and 160, respectively, and extend into the array 130.

According to this aspect of the present invention, input conductors 162, 164, 166, 168, and 170 extend different distances into array 130. Thus, input conductor 162 extends across only one row 132 of array 130 and has access to the outputs of logic function module 132-1 through user-programmable interconnect elements (shown as small circles at the outputs of logic function module); input conductor 164 extends across two rows 132 and 134 of array 130 and has access to the outputs of logic function modules 132-2 and 134-2 through user-programmable interconnect elements (shown as small circles at the outputs of logic function modules); input conductor 166 extends across three rows 132, 134, and 136 of array 130 and has access to the outputs of logic function modules 132-3, 134-3 and 136-3 through user-programmable interconnect elements (shown as small circles at the outputs of logic function modules); input conductor 168 extends across four rows 132, 134, 136, and 138 of array 130 and has access to the outputs of logic function modules 132-4, 134-4, 136-4, and 138-4 through user-programmable interconnect elements (shown as small circles at the outputs of logic function modules); and input conductor 170 extends across all five rows 132, 134, 136, 138, and 140 of array 130 and has access to the outputs of logic function modules 132-5, 134-5, 136-5, 138-5, and 140-5 through user-programmable interconnect elements (shown as small circles at the outputs of logic function modules).

FIG. 6b is a block diagram of the same array 130 illustrating a similar feature of the invention according to which output conductors of different input buffers extend different distances into the array. The same I/O pads 142, 144, 146, 148, and 150 are shown, this time connected to the inputs of input buffers 172, 174, 176, 178, and 180, respectively. Output conductors 182, 184, 186, 188, and 190 provide output data from input buffers 172, 174, 176, 178, and 180, respectively, and extend into the array 130.

According to this aspect of the present invention, output conductors 182, 184, 186, 188, and 190 extend different distances into array 130. Thus, output conductor 182 extends across only one row 132 of array 130 and has access to the inputs of logic function module 132-1 through user-programmable interconnect elements (shown as small circles at the inputs of logic function modules); output conductor 184 extends across two rows 132 and 134 of array 130 and has access to the inputs of logic function modules 132-2 and 134-2 through user-programmable interconnect elements (shown as small circles at the inputs of logic function modules); output conductor 186 extends across three rows 132, 134, and 136 of array 130 and has access to the inputs of logic function modules 132-3, 134-3 and 136-3 through user-programmable interconnect elements (shown as small circles at the inputs of logic function modules); output conductor 188 extends across four rows 132, 134, 136, and 138 of array 130 and has access to the inputs of logic function modules 132-4, 134-4, 136-4, and 138-4 through user-programmable interconnect elements (shown as small circles at the inputs of logic function modules); and output conductor 190 extends across all five rows 132, 134, 136, 138, and 140 of array 130 and has access to the inputs of logic function modules 132-5, 134-5, 136-5, 138-5, and 140-5 through user-programmable interconnect elements (shown as small circles at the inputs of logic function modules).

The exact distribution of the differing lengths of input conductors 162, 164, 166, 168, and 170, and output conductors 182, 184, 186, 188, and 190 in any actual array fabricated according to the teachings of the present invention will be a simple matter of design choice. What is important to the flexibility of the architecture of the present invention is the provision of the differing lengths of these conductors extending into the array.

Figure 7:
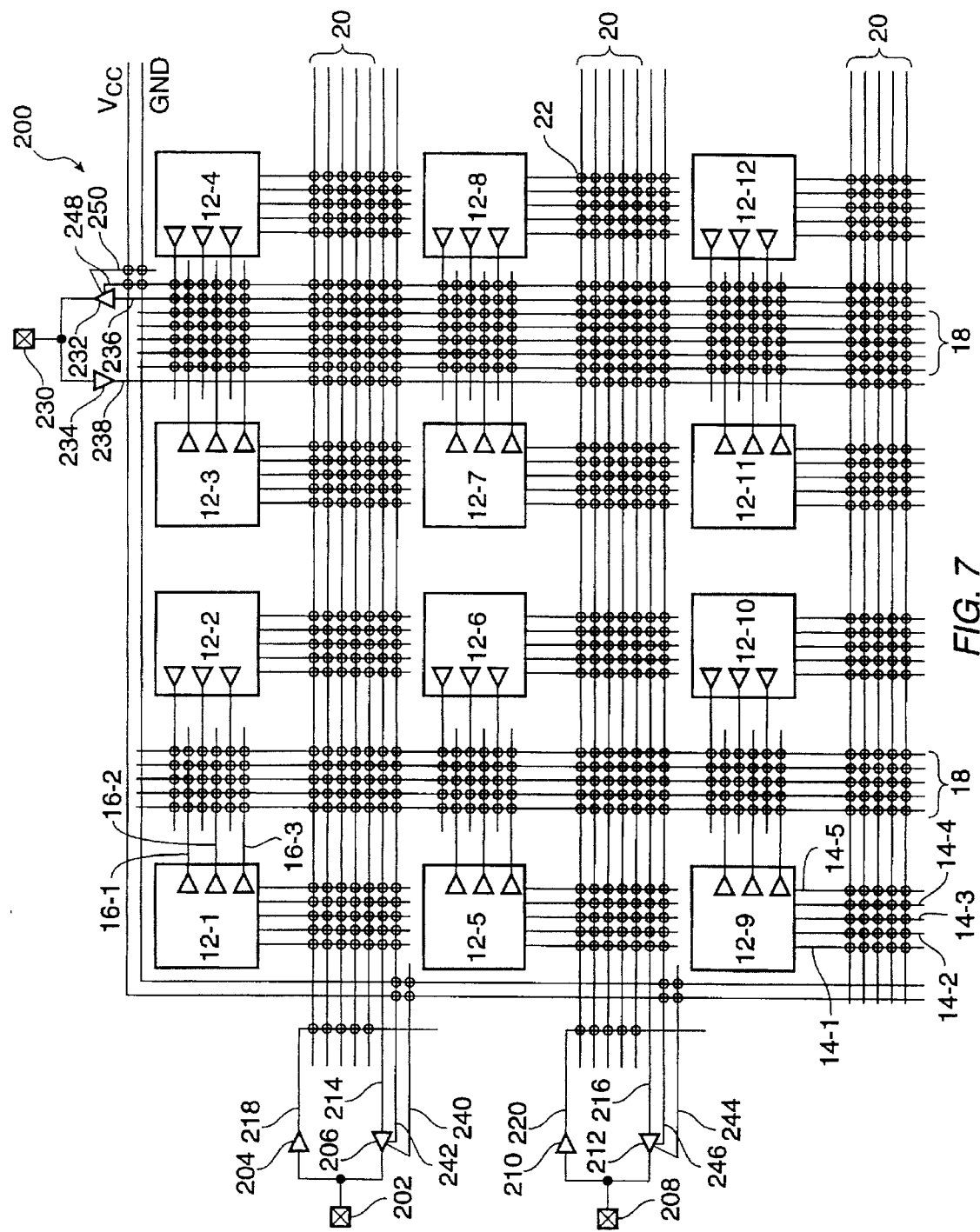
FIG. 7 is a block diagram of an FPGA array illustrating a feature of the invention according to which input and output buffers may be connected to the general interconnect allowing great flexibility in assigning I/O in FPGA architectures.

Referring now to FIG. 7, a block diagram of an FPGA array 200 illustrates a feature of the invention according to which input and output buffers may be connected to the general interconnect allowing great flexibility in assigning I/O in FPGA architectures. Array 200 of FIG. 7 is similar to the array 10 depicted in FIG. 1.

An array 200 of logic function modules contains logic function modules 12-1, 12-2, 12-3, and 12-4 in a first row of the array. A second row of the array contains logic function modules 12-5, 12-6, 12-7, and 12-8 and a third row of the array contains logic function modules 12-9, 12-10, 12-11, and 12-12.

A general interconnect architecture is superimposed on the array 200 of logic function modules 12-1 through 12-12. Two groups of vertical interconnect conductors are indicated by brackets 18. Three groups of horizontal interconnect conductors are indicated by brackets 20. The groups of vertical and horizontal interconnect conductors 18 and 20 are each shown comprising five such conductors, but persons of ordinary skill in the art will recognize that the number of conductors provided in each individual group is largely a matter of design choice, and further that the different groups of interconnect conductors may each have differing numbers of conductors.

The inputs and the outputs of logic function modules 12-1 through 12-12 intersect the interconnect conductors in groups 18 and 20. While in FIG. 7, the inputs of the logic function modules 12-1 through 12-12 are shown extending vertically downward and intersect the groups 20 of horizontal interconnect conductors and the outputs 16-1 through 16-3 of the logic function modules 12-1 through 12-12 are shown extending horizontally to the left and right and intersect the groups 18 of vertical interconnect conductors, those of ordinary skill in the art will appreciate that an architecture having the opposite arrangement could be envisioned, as well as architectures including a mixture of both horizontal and vertical extended inputs and outputs.

User-programmable interconnect elements such as the exemplary reference numeral 22 are shown as hollow circles at the intersections of the interconnect conductors and the input and output conductors of the logic function modules 12-1 through 12-12. In the exemplary architecture of FIG. 7, these intersections are shown fully populated, but less densely populated architectures also fall within the scope of the present invention.

According to the aspect of the present invention illustrated in FIG. 7, I/O pad 202 is connected to the input of input buffer 204 and to the output of output buffer 206. I/O pad 208 is connected to the input of input buffer 210 and to the output of output buffer 212. The input of output buffer 206 is connected to conductor 214 and the input of output buffer 212 is connected to conductor 216. The output of input buffer 204 is connected to conductor 218 and the output of input buffer 210 is connected to conductor 220.

Conductors 214 and 216 run into the array 200 and are shown running parallel and adjacent to the top two groups 20 of general interconnect conductors such that they intersect the inputs 14-1 through 14-5 of logic function modules. The conductor 214 intersects the inputs to logic function modules 12-1 through 12-4 and the conductor 216 intersects the inputs to logic function modules 12-5 through 12-8. User-programmable interconnect conductors are shown disposed at these intersections.

Conductors 218 and 220 also intersect the general interconnect lines 20, conductor 218 intersecting the interconnect lines of the upper group 20 and conductor 220 intersecting the interconnect lines of the center group 20. User-programmable interconnect elements are shown as hollow circles at the intersections of conductors 218 and 220 and the respective interconnect conductors of the groups 20.

I/O pad 230 is shown at the top of FIG. 7, connected to the output of output buffer 232 and to the input of input buffer 234. The input of output buffer 232 is connected to conductor 236 and the output of input buffer 234 is connected to conductor 238. Conductors 236 and 238 extend vertically downward into the array 200 parallel to the group 18 of vertical interconnect conductors, forming intersections with output of the logic function modules 12-3, 12-4, 12-7, 12-8, 12-11, and 12-12 and also forming intersections with the individual general interconnect conductors in the three groups 20 of horizontal interconnect conductors. User-programmable interconnect elements are shown as hollow circles at the intersections of conductors 236 and 238 and the outputs of the logic function modules 12-3, 12-4, 12-7, 12-8, 12-11, and 12-12 as well as the respective interconnect conductors of the groups 20 of horizontal interconnect conductors.

As may be seen from an examination of FIG. 7, the FPGA architecture according to this aspect of the present invention is extremely flexible, since any input or output connection may be routed to or from any logic function module 12-1 through 12-12. Prior art architectures do not allow such connectivity, providing instead only connectivity to fixed location I/O modules. The present invention allows more available choices for place and route software to connect logic function modules to I/O pads as required by the user's application. In addition, performance of the integrated circuit is enhanced because employing fewer programmable connections between I/O pads and logic functions modules provides faster input and output signal paths.

Those of ordinary skill in the art will recognize that the I/O architecture described herein could be equipped with further features, for example testing features such as JTAG boundary scan techniques or the like, or other logic functions and features.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A field-programmable gate array architecture disposed on an integrated circuit, including:

a plurality of logic function modules in an array of rows and columns, each of said modules having at least one input conductor and at least one output conductor;

a plurality of input/output pads;

a plurality of input/output kernels, each input/output kernel comprising an input buffer having a data input connected to one of said I/O pads and a data output connected to an input buffer data conductor, an output buffer having a data input connected to an output buffer data conductor, a data output connected to said one of said I/O pads, and an enable input connected to an output buffer enable conductor;

said input buffer data conductors extending in a direction comprising one of along said rows and along said columns, some ones of said input buffer data conductors extending different numbers of said rows or said columns than other ones of said input buffer data conductors, said input buffer data conductors forming first intersections with ones of said inputs of said modules;

said output buffer data conductors and said output buffer enable conductors extending in a direction comprising one of along said rows and along said columns, some ones of said output buffer data conductors and said output buffer enable conductors extending different numbers of said rows or said columns than other ones of said output buffer data conductors and said output buffer enable conductor, said output buffer data conductors and said output buffer enable conductors forming second intersections with ones of said outputs of said modules; and user-programmable interconnect elements connected across selected ones of said first and second intersections.

2. The field-programmable gate array architecture of claim 1 wherein said user-programmable interconnect elements are connected across all of said first intersections.

3. The field-programmable gate array architecture of claim 1 wherein said user-programmable interconnect elements are connected across all of said second intersections.

4. The field-programmable gate array architecture of claim 1 wherein said user-programmable interconnect elements are connected across all of said first and second intersections.

5. The field-programmable gate array architecture of claim 1 wherein at least two of said output buffer data conductors are connectable to at least one common one of said outputs of said modules by user-programmable interconnect elements.

6. The field-programmable gate array architecture of claim 1 wherein said input/output kernels further include output buffer slew rate control conductors forming a Vcc intersection with a Vcc conductor and a ground intersection with a ground conductor, user-programmable interconnect elements disposed at said Vcc and ground intersections.

7. The field-programmable gate array architecture of claim 1, further including:

a plurality of interconnect conductors, at least some of said interconnect conductors forming third intersections with ones of said input buffer data conductors; and user-programmable interconnect elements connected across selected ones of said third intersections.

8. The field-programmable gate array architecture of claim 1, further including:

a plurality of interconnect conductors, at least some of said interconnect conductors forming third intersections with ones of said output buffer data conductors; and user-programmable interconnect elements connected across selected ones of said third intersections.

9. The field-programmable gate array architecture of claim 1, further including:

a plurality of interconnect conductors, at least some of said interconnect conductors forming third intersections with ones of said output buffer enable conductors; and user-programmable interconnect elements connected across selected ones of said third intersections.

10. A field-programmable gate array architecture disposed on an integrated circuit, including:

a plurality of logic function modules in an array of rows and columns, each of said modules having at least one input conductor and at least one output conductor;

a plurality of interconnect conductors;

a plurality of input/output pads;

a plurality of input/output kernels, each input/output kernel comprising an input buffer having a data input connected to one of said I/O pads and a data output connected to an input buffer data conductor, an output buffer having a data input connected to an output buffer data conductor, a data output connected to said one of said I/O pads, and an enable input connected to an output buffer enable conductor;

said input buffer data conductors extending a first length in a direction comprising one of along said rows and along said columns and a second length in the other direction comprising one of along said rows and along said columns, said input buffer data conductors forming first intersections with ones of said inputs of said modules and ones of said interconnect conductors;

said output buffer data conductors extending a first length in a direction comprising one of along said rows and along said columns and a second length in the other direction comprising one of along said rows and along said columns, said output buffer data conductors forming second intersections with ones of said outputs of said modules and ones of said interconnect conductors; and user-programmable interconnect elements connected across selected ones of said first and second intersections.

11. The field-programmable gate array architecture of claim 10 wherein different ones of said input buffer data conductors extend different first and second lengths.

12. The field-programmable gate array architecture of claim 10 wherein different ones of said output buffer data conductors extend different first and second lengths.

13. The field-programmable gate array architecture of claim 10 wherein at least some of said output buffer enable conductors extend a first length in a direction comprising one of along said rows and along said columns and a second length in the other direction comprising one of along said rows and along said columns, said output buffer enable conductors forming third intersections with ones of said outputs of said modules; and user-programmable interconnect elements connected across selected ones of said third intersections.

14. The field-programmable gate array architecture of claim 10, further including:
a third plurality of interconnect conductors, at least some of said interconnect conductors forming third intersections with ones of said input buffer data conductors; and
user-programmable interconnect elements connected across selected ones of said third intersections.

15. The field-programmable gate array architecture of claim 10, further including:
a third plurality of interconnect conductors, at least some of said interconnect conductors forming third intersections with ones of said output buffer data conductors; and
user-programmable interconnect elements connected across selected ones of said third intersections.

16. The field-programmable gate array architecture of claim 10, further including:
a third plurality of interconnect conductors, at least some of said interconnect conductors forming third intersections with ones of said output buffer enable conductors; and
user-programmable interconnect elements connected across selected ones of said third intersections.

17. A field-programmable gate array architecture disposed on an integrated circuit, including:
a plurality of logic function modules in an array of rows and columns, each of said modules having at least one input conductor and at least one output conductor;
a plurality of input/output pads;
a plurality of general interconnect conductors forming first intersections with inputs from ones of said logic function modules;
a plurality of input/output kernels, each input/output kernel comprising an input buffer having a data input connected to one of said I/O pads and a data output connected to an input buffer data conductor, an output buffer having a data input connected to an output buffer data conductor, a data output connected to said one of said I/O pads, and an enable input connected to an output buffer enable conductor;
said input buffer data conductors extending in a column direction, different ones of said input buffer data conductors extending different numbers of said rows columns and forming second intersections with ones of said plurality of general interconnect conductors;
said output buffer data conductors and said output buffer enable conductors extending in a column direction, different ones of said output buffer data conductors and said output buffer enable conductors extending different numbers of said rows, said output buffer data conductors and said output buffer enable conductors forming third intersections with ones of said outputs of said modules; and
user-programmable interconnect elements connected across selected ones of said first, second, and third intersections.

18. The field-programmable gate array architecture of claim 17 wherein user-programmable interconnect elements are connected across all of said first intersections.

19. The field-programmable gate array architecture of claim 17 wherein user-programmable interconnect elements are connected across all of said second intersections.

20. The field-programmable gate array architecture of claim 17 wherein user-programmable interconnect elements are connected across all of said third intersections.

21. A field-programmable gate array architecture disposed on an integrated circuit, including:
a plurality of logic function modules in an array of rows and columns, each of said modules having at least one input conductor and at least one output conductor;
a plurality of input/output pads;
a plurality of general interconnect conductors forming first intersections with inputs from ones of said logic function modules;
a plurality of input/output kernels, each input/output kernel comprising an input buffer having a data input connected to one of said I/O pads and a data output connected to an input buffer data conductor, an output buffer having a data input connected to an output buffer data conductor, a data output connected to said one of said I/O pads, and an enable input connected to an output buffer enable conductor;
said input buffer data conductors extending in a row direction, different ones of said input buffer data conductors extending different numbers of said columns and forming second intersections with ones of said plurality of general interconnect conductors;
said output buffer data conductors and said output buffer enable conductors extending in a row direction, different ones of said output buffer data conductors and said output buffer enable conductors extending different numbers of said columns, said output buffer data conductors and said output buffer enable conductors forming third intersections with ones of said outputs of said modules; and
user-programmable interconnect elements connected across selected ones of said first, second, and third intersections.

22. The field-programmable gate array architecture of claim 21 wherein user-programmable interconnect elements are connected across all of said first intersections.

23. The field-programmable gate array architecture of claim 21 wherein user-programmable interconnect elements are connected across all of said second intersections.

24. The field-programmable gate array architecture of claim 21 wherein user-programmable interconnect elements are connected across all of said third intersections.

25. A field-programmable gate array architecture disposed on an integrated circuit, including:
a plurality of logic function modules in an array of rows and columns, each of said modules having at least one input conductor and at least one output conductor;
a plurality of input/output pads;
a plurality of general interconnect conductors forming first intersections with outputs from ones of said logic function modules;
a plurality of input/output kernels, each input/output kernel comprising an input buffer having a data input connected to one of said I/O pads and a data output connected to an input buffer data conductor, an output buffer having a data input connected to an output buffer data conductor, a data output connected to said one of said I/O pads, and an enable input connected to an output buffer enable conductor;
said input buffer data conductors extending in a column direction, different ones of said input buffer data conductors extending different numbers of said rows and forming second intersections with inputs of ones of said logic function modules;

said output buffer data conductors and said output buffer enable conductors extending in a column direction, different ones of said output buffer data conductors and said output buffer enable conductors extending different numbers of said rows, said output buffer data conductors forming third intersections with ones of said general interconnect conductors; and user-programmable interconnect elements connected across selected ones of said first, second, and third intersections.

26. The field-programmable gate array architecture of claim 25 wherein user-programmable interconnect elements are connected across all of said first intersections.

27. The field-programmable gate array architecture of claim 25 wherein user-programmable interconnect elements are connected across all of said second intersections.

28. The field-programmable gate array architecture of claim 25 wherein user-programmable interconnect elements are connected across all of said third intersections.

29. A field-programmable gate array architecture disposed on an integrated circuit, including:

a plurality of logic function modules in an array of rows and columns, each of said modules having at least one input conductor and at least one output conductor;

a plurality of input/output pads;

a plurality of general interconnect conductors forming first intersections with outputs from ones of said logic function modules;

a plurality of input/output kernels, each input/output kernel comprising an input buffer having a data input connected to one of said I/O pads and a data output connected to an input buffer data conductor, an output buffer having a data input connected to an output buffer data conductor, a data output connected to said one of said I/O pads, and an enable input connected to an output buffer enable conductor;

said input buffer data conductors extending in a row direction, different ones of said input buffer data conductors extending different numbers of said columns and forming second intersections with inputs of ones of said logic function modules;

said output buffer data conductors and said output buffer enable conductors extending in a row direction, different ones of said output buffer data conductors and said output buffer enable conductors extending different numbers of said columns, said output buffer data conductors forming third intersections with ones of said general interconnect conductors; and user-programmable interconnect elements connected across selected ones of said first, second, and third intersections.

30. The field-programmable gate array architecture of claim 29 wherein user-programmable interconnect elements are connected across all of said first intersections.

31. The field-programmable gate array architecture of claim 29 wherein user-programmable interconnect elements are connected across all of said second intersections.

32. The field-programmable gate array architecture of claim 29 wherein user-programmable interconnect elements are connected across all of said third intersections.

33. A field-programmable gate array architecture disposed on an integrated circuit, including:

a plurality of logic function modules in an array of rows and columns, each of said modules having at least one input conductor and at least one output conductor;

a plurality of input/output pads;

a plurality of input/output kernels, each input/output kernel comprising an input buffer having a data input connected to one of said I/O pads and a data output connected to an input buffer data conductor, an output buffer having a data input connected to an output buffer data conductor, a data output connected to said one of said I/O pads, and an enable input connected to an output buffer enable conductor;

said input buffer data conductors extending in a direction comprising one of along said rows and along said columns, some ones of said input buffer data conductors extending different numbers of said rows or said columns than other ones of said input buffer data conductors, said input buffer data conductors forming first intersections with ones of said inputs of said modules;

said output buffer data conductors extending in a direction comprising one of along said rows and along said columns, some ones of said output buffer data conductors extending different numbers of said rows or said columns than other ones of said output buffer data conductors, said output buffer data conductors forming second intersections with ones of said outputs of said modules;

user-programmable interconnect elements connected across selected ones of said first and second intersections;

a global enable conductor extending both along said rows and along said columns, said global enable conductor forming third intersections with at least some of said output buffer enable conductors; and user-programmable interconnect elements connected across at least some of said third intersections.

34. The field-programmable gate array architecture of claim 33, wherein said global enable conductor is disposed substantially near the periphery of the array and comprises one segment running in a row direction and one segment running in a column direction.

35. The field-programmable gate array architecture of claim 33, wherein said global enable conductor is disposed substantially near the periphery of the array and comprises at least one segment running in a row direction and at least one segment running in a column direction.

* * * * *

UNITED STATES PATENT AND TRADEMARK OFFICE
CERTIFICATE OF CORRECTION

PATENT NO. : 5,625,301
DATED : April 29, 1997
INVENTOR(S) : William C. Plants, Sinan Kaptanoglu, Jung Cheun Lien, Richard Chan and Khaled A. El-Ayat It is certified that error appears in the above-indentified patent and that said Letters Patent is hereby corrected as shown below:

On the title page: Item [56]

In the References Cited section:

Please replace "5,896,296 1/990 Turner et al." with --4,896,296 1/1990 Turner et al.--.

Column 1, lines 55-56: replace "usually takes" with --usually take--.

Column 3, line 3: replace "an FPGA" with --a FPGA--.

Column 3, lines 48-49: replace "an FPGA" with --a FPGA--.

Column 3, lines 52-53: replace "an FPGA" with --a FPGA--.

Column 3, line 57: replace "an FPGA" with --a FPGA--.

Column 3, line 61: replace "an FPGA" with --a FPGA--.

Column 3, line 65: replace "an FPGA" with --a FPGA--.

Column 6, line 66: replace "input conductor" with --input conductors--.

Column 7, line 35: replace "has been" with --have been--.

Column 10, line 43: replace "136-5." with --136-5,--.

Column 11, line 25: replace "an FPGA" with --a FPGA--.

UNITED STATES PATENT AND TRADEMARK OFFICE
CERTIFICATE OF CORRECTION

PATENT NO. : 5,625,301
DATED : April 29, 1997
INVENTOR(S) : William C. Plants, Sinan Kaptanoglu, Jung Cheun Lien, Richard Chan and Khaled A. El-Ayat It is certified that error appears in the above-indentified patent and that said Letters Patent is hereby corrected as shown below:

Column 11, line 49: after the text "The inputs": insert --14–1 through 14–5 (exemplified in logic function module 12–9)--. Column 11, line 49: after the text "The outputs": insert --16–1 through 16–3 (exemplified in logic function module 12–1)--.

Column 11, line 51: after the text "FIG. 7, the inputs": insert --14–1 through 14–3--.

<u>In the claims</u>:

Column 15, lines 46-47: replace "said rows columns and" with --said rows and--.

Signed and Sealed this

Sixteenth Day of September, 1997

Attest:

BRUCE LEHMAN

*Attesting Officer*      *Commissioner of Patents and Trademarks*